United States Patent
Yoshida

(10) Patent No.: US 8,237,480 B2
(45) Date of Patent: *Aug. 7, 2012

(54) CLOCK GENERATION CIRCUIT AND INTEGRATED CIRCUIT

(75) Inventor: Daisuke Yoshida, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/104,771

(22) Filed: May 10, 2011

(65) Prior Publication Data

US 2011/0210778 A1   Sep. 1, 2011

Related U.S. Application Data

(63) Continuation of application No. 12/606,025, filed on Oct. 26, 2009, now Pat. No. 7,952,409.

(30) Foreign Application Priority Data

Nov. 28, 2008  (JP) .................................. 2008-305627

(51) Int. Cl.
   *H03H 11/16* (2006.01)
(52) U.S. Cl. ........................................ 327/239; 327/259
(58) Field of Classification Search .................. 327/237, 327/239, 259, 261, 295
   See application file for complete search history.

(56) References Cited

U.S. PATENT DOCUMENTS

| 5,883,534 | A | 3/1999 | Kondoh et al. | |
| 5,977,809 | A | 11/1999 | Wang et al. | |
| 6,900,682 | B2 | 5/2005 | Truong et al. | |
| 7,239,300 | B2 * | 7/2007 | Shimizu | 345/100 |
| 7,459,952 | B2 | 12/2008 | Ogita | |
| 7,855,588 | B2 | 12/2010 | Sagisaka et al. | |
| 7,952,409 | B2 * | 5/2011 | Yoshida | 327/239 |
| 8,035,581 | B2 * | 10/2011 | Choi | 345/76 |

FOREIGN PATENT DOCUMENTS

| JP | 2002-108492 | 4/2002 |
| JP | 3688392 | 8/2005 |

* cited by examiner

*Primary Examiner* — Hai L Nguyen
(74) *Attorney, Agent, or Firm* — Fitzpatrick, Cella, Harper & Scinto

(57) ABSTRACT

A clock generation circuit comprises: a first generation unit; a second generation unit; and a control unit that, using a plurality of third delay elements that respectively have a propagation delay time that correlates with the propagation delay time of a first delay element, and correlates with the propagation delay time of a second delay element, generates a control signal for controlling the third delay elements such that a total of propagation delay times of the plurality of third delay elements corresponds to a target value depending on a cycle of the external clock, and controls the propagation delay time of the first delay element, the propagation delay time of the second delay element, and the propagation delay times of the third delay elements using the control signal.

14 Claims, 10 Drawing Sheets

F I G. 2
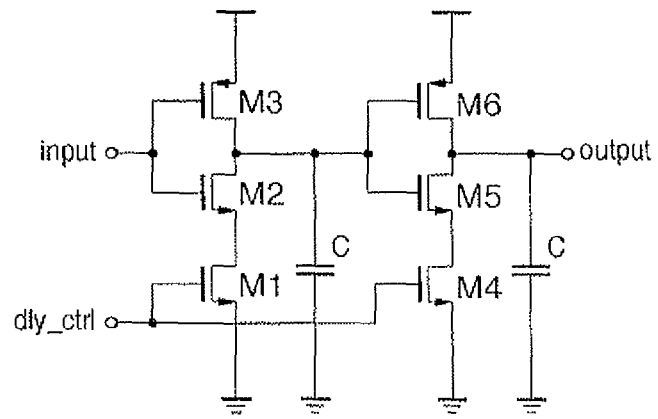
F I G. 3
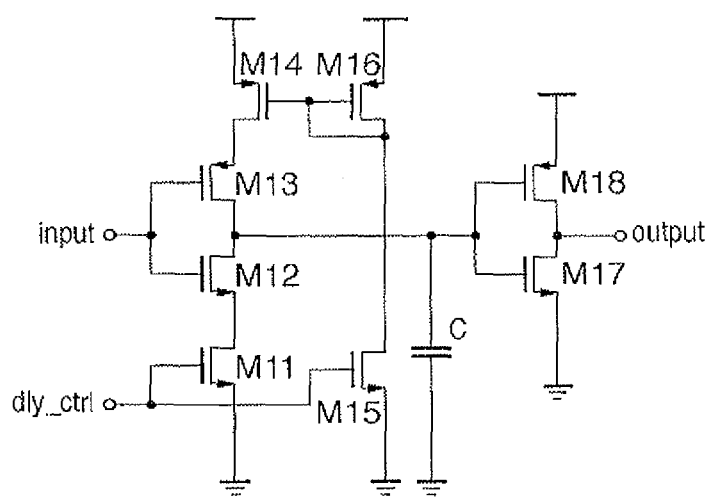
F I G. 4
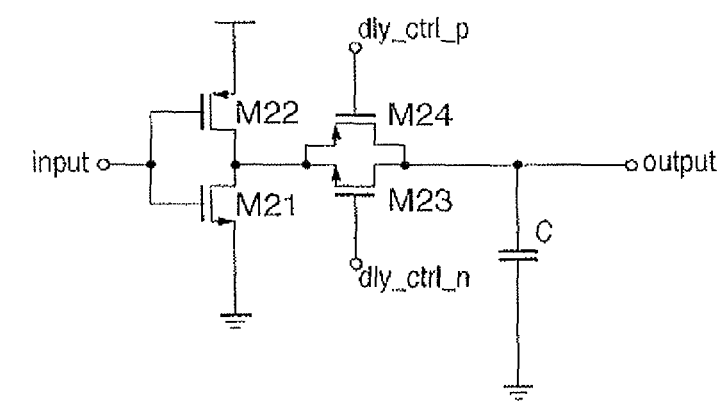

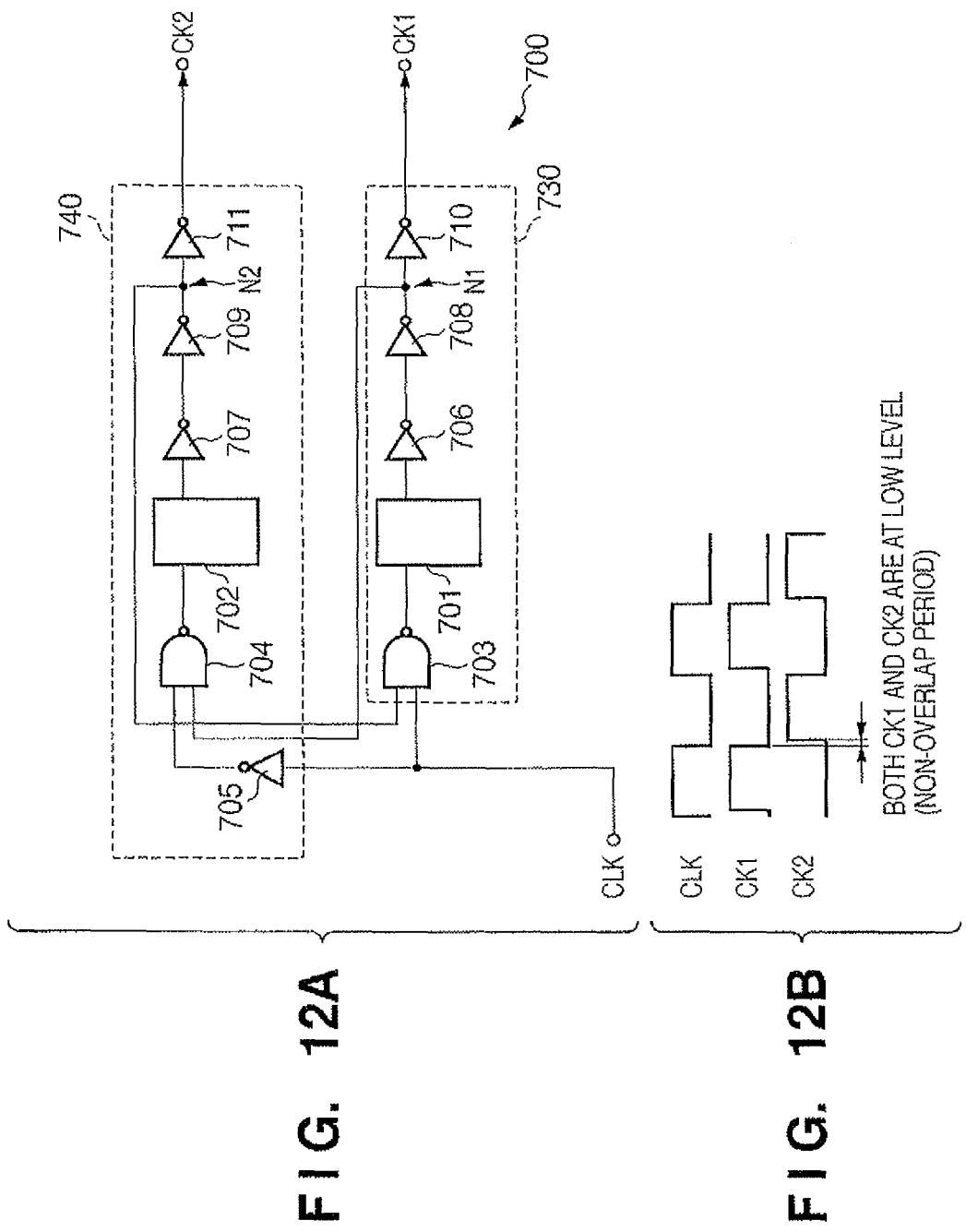

CLOCK GENERATION CIRCUIT AND INTEGRATED CIRCUIT

This application is a continuation of application Ser. No. 12/606,025, filed Oct. 26, 2009, now U.S. Pat. No. 7,952,409, issued on May 31, 2011, the contents of which are incorporated by reference herein.

BACKGROUND OF THE INVENTION

1. Field of the Invention

The present invention relates to a clock generation circuit and an integrated circuit.

2. Description of the Related Art

In Japanese Patent Laid-Open No. 2002-108492, a two-phase clock signal-generating device 1 for generating a two-phase clock signal (an A phase clock signal, a B phase clock signal) used in a circuit device such as an ECU of a car is described as shown in FIG. 2 of Japanese Patent Laid-Open No. 2002-108492. In the two-phase clock signal-generating device 1, a CPU 3 reads sensor signals from a temperature sensor 6 and a voltage sensor 7, and determines data for setting a delay time d according to the temperature and voltage at that point in time based on a data table stored in a memory 5. A two-phase clock signal generating unit 4 receives, from the CPU 3, the data for setting the delay time d determined by the CPU 3. In the delay control units 12a and 12b of the two-phase clock signal generating unit 4, as shown in FIG. 1(b) of Japanese Patent Laid-Open No. 2002-108492, a decoder 16 decodes the setting data and outputs a closing control signal to any one of switches 15. Accordingly, in the delay control units 12a and 12b, the number of stages of a delay buffer 14 into which an input signal passes is determined. In the two-phase clock signal generating unit 4, as shown in FIG. 1(a) of Japanese Patent Laid-Open No. 2002-108492, the delay time d is added to an A phase clock signal by the delay control unit 12a, and the resultant signal is input into the input terminal of an OR gate 9. Further, the delay time d is added to a B phase clock signal by the delay control unit 12b, and the resultant signal is input into the input terminal of an OR gate 10. This delay time d provides a non-overlap period in which both the A phase clock signal and the B phase clock signal are at a low level as shown in FIG. 3 of Japanese Patent Laid-Open No. 2002-108492.

In this way, according to Japanese Patent Laid-Open No. 2002-108492, even in a case in which the temperature/voltage changes, which is the operational environment of a circuit device such as an ECU of a car, it is thought that the non-overlap period of the two-phase clock signal used in the circuit device can be adjusted so as to be constant.

As described above, there are many cases in which a non-overlap period of a two-phase clock is designed so as to be adjusted using a delay element with propagation delay characteristics of a logical gate such as an inverter circuit, or with propagation delay characteristics of a capacitance load or the like. Among these, the propagation delay characteristics of the logical gate will change according to changes in element characteristics due to the power supply voltage, temperature fluctuation, or variations in the manufacturing process. If a two-phase clock is generated using such a delay element, the non-overlap period of the two-phase clock will vary.

Here, considering the case in which an AD converter configured from a switched capacitor is operated using a two-phase clock, a non-overlap period is a period in which an amplifier circuit does not perform either a sampling operation or a holding operation. Consequently, in particular, in a high-speed AD converter and the like, if a non-overlap period is designed to be as short as possible, it is possible to secure a longer time for a sampling operation and a longer time for a holding operation, which is advantageous.

However, if the non-overlap period of a two-phase clock varies, when shortening the non-overlap period, the circuit may malfunction due to skew between the clocks, which could not be expected when designing the circuit, and so on. Accordingly, this sets a limit when shortening the non-overlap period.

With the technique disclosed in Japanese Patent Laid-Open No. 2002-108492, in the case in which the non-overlap time of a two-phase clock varies because of variations in element characteristics due to the manufacturing process, it may be impossible to adjust the non-overlap period of a two-phase clock signal so as to be constant.

SUMMARY OF THE INVENTION

The present invention provides for outputting a plurality of clocks whose phase relationship has been adjusted so as to be constant according to the cycle of an external clock even when element characteristics change due to the power supply voltage, temperature fluctuation, or variations in the manufacturing process.

According to a first aspect of the present invention, there is provided a clock generation circuit that generates and outputs a plurality of clocks that have a different delay time relative to an external clock, the clock generation circuit comprising: a first generation unit that generates, by causing the external clock to pass through a first delay element, a first clock that has a first delay time depending on a propagation delay time of the first delay element relative to the external clock, and outputs the generated first clock; a second generation unit that generates, by causing the external clock to pass through a second delay element, a second clock that has a second delay time depending on a propagation delay time of the second delay element relative to the external clock, and outputs the generated second clock; and a control unit that, using a plurality of third delay elements that respectively have a propagation delay time that correlates with the propagation delay time of the first delay element, and correlates with the propagation delay time of the second delay element, generates a control signal for controlling the third delay elements such that a total of propagation delay times of the plurality of third delay elements corresponds to a target value depending on a cycle of the external clock, and controls the propagation delay time of the first delay element, the propagation delay time of the second delay element, and the propagation delay times of the third delay elements using the control signal.

According to a second aspect of the present invention, there is provided a clock generation circuit that generates and outputs a plurality of clocks that have a non-overlap period with respect to an external clock, the clock generation circuit comprising: a first generation unit including a first delay element, that generates, by causing the external clock to pass through the first delay element, a first clock that has a first delay time depending on a propagation delay time of the first delay element relative to the external clock, and outputs the generated first clock; a second generation unit including a second delay element, that generates, by causing the external clock to pass through the second delay element, a second clock that has a second delay time depending on a propagation delay time of the second delay element relative to the external clock, and outputs the generated second clock; and a control unit including a plurality of third delay elements, that generates a control signal for controlling the third delay elements such that a total of propagation delay times caused by the plurality of third delay elements corresponds to a target value depending on a cycle of the external clock by causing the external clock to pass through the plurality of third delay elements, and controls, by supplying the control signal to the first delay element, the second delay element, and the plurality of third delay elements, respectively, the propagation delay time of the first delay element, the propagation delay time of the second delay element, and the propagation delay time of the third delay element.

According to a third aspect of the present invention, there is provided a clock generation circuit that generates and outputs a plurality of clocks that have a non-overlap period with respect to an external clock, the clock generation circuit comprising: a first generation unit including a first delay element, that generates, by causing the external clock to pass through the first delay element, a first clock that has a first delay time depending on a propagation delay time of the first delay element relative to the external clock, and outputs the generated first clock; a second generation unit including a second delay element, that generates, by causing the external clock to pass through the second delay element, a second clock that has a second delay time depending on a propagation delay time of the second delay element relative to the external clock, and outputs the generated second clock; and a control unit including a plurality of third delay elements, that oscillates at a frequency depending on a total of propagation delay times caused by the plurality of third delay elements so as to generate a third clock, generates a control signal for controlling the third delay elements such that the total of the propagation delay times of the plurality of third delay elements corresponds to a target value depending on a cycle of the external clock by comparing a phase of a frequency division clock obtained by dividing a frequency of the generated third clock with a phase of the external clock, and controls, by supplying the control signal to the first delay element, the second delay element, and the plurality of third delay elements, respectively, the propagation delay time of the first delay element, the propagation delay time of the second delay element, and the propagation delay time of the third delay element.

According to a fourth aspect of the present invention, there is provided an integrated circuit comprising: a clock generation circuit according to the first to third aspect of the present invention; and an AD converter that operates using the first clock and the second clock output from the clock generation circuit.

According to the present invention, it is possible to output a plurality of clocks whose phase relationship has been adjusted so as to be constant according to the cycle of an external clock even when element characteristics change due to the power supply voltage, temperature fluctuation, or variations in the manufacturing process.

Further features of the present invention will become apparent from the following description of exemplary embodiments with reference to the attached drawings.

BRIEF DESCRIPTION OF THE DRAWINGS

FIG. 2 is a diagram showing an example configuration of a first delay element 101, a second delay element 102, or each of third delay elements 121 to 126.

FIG. 3 is a diagram showing another example of the configuration of the first delay element 101, the second delay element 102, or each of the third delay elements 121 to 126.

FIG. 4 is a diagram showing yet another example of the configuration of the first delay element 101, the second delay element 102, or each of the third delay elements 121 to 126.

FIGS. 12A and 12B are diagrams showing the configuration of and an operation performed by a clock generation circuit 700.

DESCRIPTION OF THE EMBODIMENTS

Figure 1:
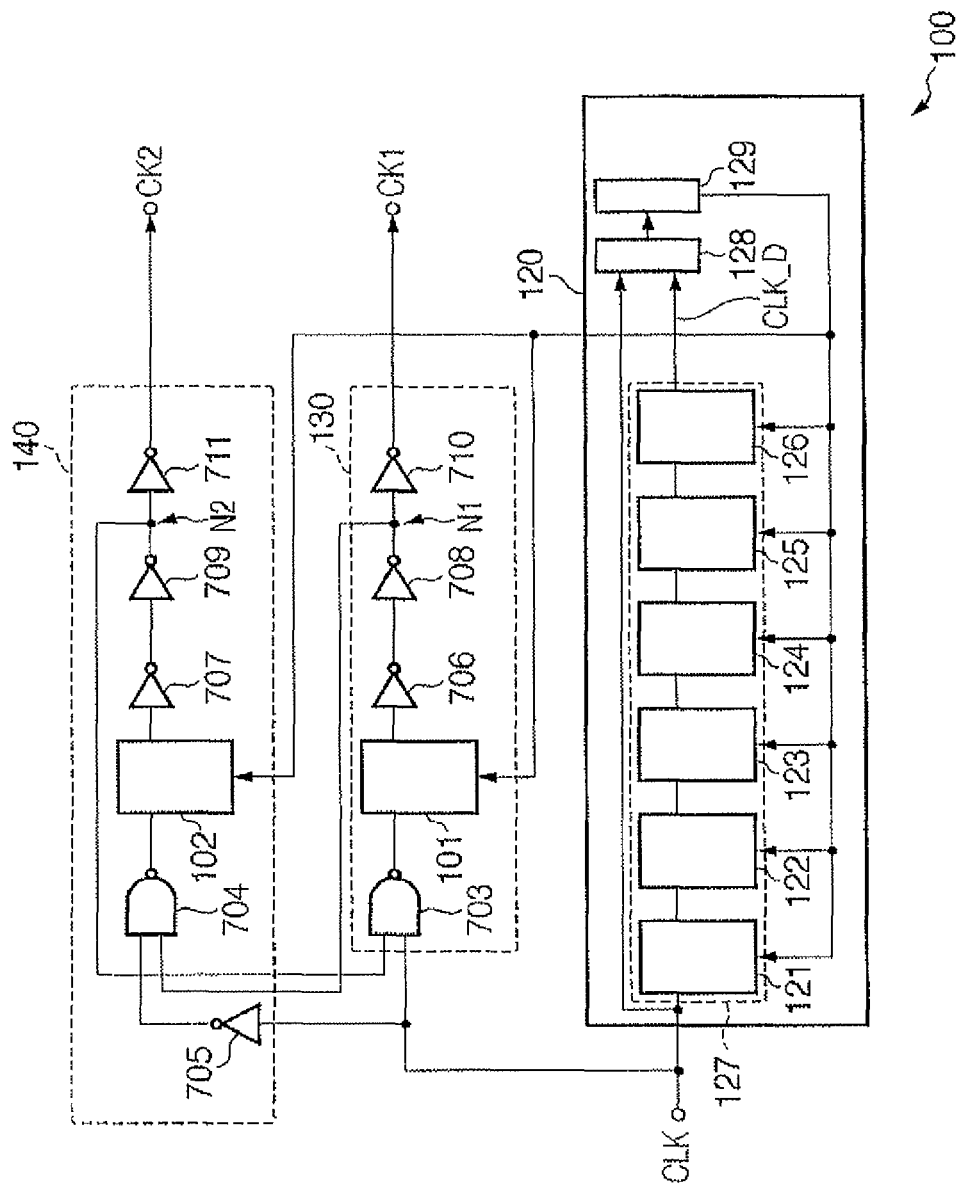
FIG. 1 is a diagram showing the configuration of a clock generation circuit 100 according to a first embodiment of the present invention.

The configuration and operations of a clock generation circuit 700 are described with reference to FIGS. 12A and 12B. FIG. 12A is a diagram showing the configuration of the clock generation circuit 700. FIG. 12B is a diagram showing the operation performed by the clock generation circuit 700.

The clock generation circuit 700 generates and outputs a plurality of clocks CK1 and CK2 that have different delay times relative to an external clock CLK. The clock generation circuit 700 is provided with a first generation unit 730 and a second generation unit 740.

The first generation unit 730 includes a NAND gate 703, a first delay element 701, an inverter 706, an inverter 708, and an inverter 710.

The NAND gate 703 performs a NAND operation between the external clock CLK and a clock supplied from a node N2 of the second generation unit 740, and supplies the resultant clock to the first delay element 701.

The first delay element 701 delays a clock supplied from the NAND gate 703 for a predetermined propagation delay time, and supplies the delayed clock to the inverter 706. That is, the propagation delay time caused by the first delay element 701 cannot be controlled.

The inverter 706 delays the clock supplied from the first delay element 701 for a predetermined delay time, and supplies the delayed clock to the inverter 708.

The inverter 708 delays the clock supplied from the inverter 706 for a predetermined delay time, and supplies the delayed clock to the inverter 710 via a node N1.

The inverter 710 delays the clock supplied from the inverter 708 for a predetermined delay time, and outputs the delayed clock to the outside as the first clock CK1.

In this way, the first generation unit 730 generates and outputs the first clock CK1 that has a first delay time depending on the propagation delay time caused by the first delay element 701 relative to the external clock CLK, by causing the external clock CLK to pass through the first delay element 701.

The second generation unit 740 includes an inverter 705, a NAND gate 704, a second delay element 702, an inverter 707, an inverter 709, and an inverter 711.

The inverter 705 inverts the external clock CLK, and supplies the inverted clock to the NAND gate 704.

The NAND gate 704 performs a NAND operation between the clock supplied from the inverter 705, and the clock supplied from the node N1 of the first generation unit 730, and supplies the resultant clock to the second delay element 702.

The second delay element 702 delays the clock supplied from the NAND gate 704 for a predetermined propagation delay time, and supplies the delayed clock to the inverter 707. That is, the propagation delay time caused by the second delay element 702 cannot be controlled.

The inverter 707 delays the clock supplied from the second delay element 702 for a predetermined delay time, and supplies the delayed clock to the inverter 709.

The inverter 709 delays the clock supplied from the inverter 707 for a predetermined delay time, and supplies the delayed clock to the inverter 711 via the node N2.

The inverter 711 delays the clock supplied from the inverter 709 for a predetermined delay time, and outputs the delayed clock to the outside as the second clock CK2.

In this way, the second generation unit 740 generates and outputs the second clock CK2 that has a second delay time depending on the propagation delay time caused by the second delay element 702 relative to the external clock CLK, by causing the external clock CLK to pass through the second delay element 702.

If the delay time caused by delay elements 701 and 702 are the same, the second delay time is greater by the amount corresponding to the delay time caused by the inverter 705, compared with the first delay time. Because a NAND operation is performed between the signal at node N1 and the inverted external clock CLK, and also between the signal at node N2 and the external clock, a period in which both the first clock CK1 and the second clock CK2 are at a non-active level (for example, a low level) is generated as shown in FIG. 12B. This period is a non-overlap period of a two-phase clock (i.e. the first clock CK1 and the second clock CK2). Owing to the shorter delay time caused by the inverters 705-711 and the NAND gates 703-704 compared to the propagation delay time caused by the delay elements 701-702, the non-overlap period is mainly dominated by the propagation delay time of the delay elements 701-702.

Examples of a circuit that operates using a two-phase clock that has such a non-overlap period include a pipelined AD converter configured from a shift register and a switched capacitor, and the like as a typical example. In particular, in a pipelined AD converter, an amplifier circuit that constitutes a stage repeats a sampling operation and a holding operation by turns for every clock period. Here, a non-overlap period is a period when an amplifier circuit does not perform either a sampling operation or a holding operation. In other words, a margin period in which a period for a sampling operation and a period for a holding operation do not overlap. In particular, in a high-speed AD converter and the like, if a non-overlap period is designed to be as short as possible, it is possible to secure a longer period for a sampling operation and a longer period for a holding operation, which is advantageous.

Here, the propagation delay time caused by the first delay element 701 and the propagation delay time caused by the second delay element 702 will change, respectively, because of changes in element characteristics due to the power supply voltage, temperature fluctuation, or variations in the manufacturing process. That is, if element characteristics change due to the power supply voltage, temperature fluctuation, or variations in the manufacturing process, a non-overlap period of a two-phase clock varies. If the non-overlap period of a two-phase clock varies, when shortening such a non-overlap period, the circuit may malfunction due to skew between the clocks, which could not be expected when designing the circuit, and so on. Accordingly, this sets a limit when shortening a non-overlap period.

Next, a clock generation circuit 100 according to a first embodiment of the present invention is described with reference to FIG. 1. FIG. 1 is a diagram showing the configuration of the clock generation circuit 100 according to the first embodiment of the present invention. In the following, a description is given focusing on the points that differ from those of the clock generation circuit 700 shown in FIG. 12A.

The clock generation circuit 100 is provided with a first generation unit 130, a second generation unit 140, and a control unit 120.

The first generation unit 130 includes a first delay element 101. The first delay element 101 receives a control signal from the control unit 120. The first delay element 101 delays a clock supplied from the NAND gate 703 for the propagation delay time according to the received control signal, and supplies the delayed clock to the inverter 706. That is, the propagation delay time caused by the first delay element 101 can be controlled.

The second generation unit 140 includes a second delay element 102. The second delay element 102 receives a control signal from the control unit 120. The second delay element 102 delays a clock supplied from the NAND gate 704 for the propagation delay time according to the received control signal, and supplies the delayed clock to the inverter 707. That is, the propagation delay time caused by the second delay element 102 can be controlled.

The control unit 120 generates a control signal for controlling third delay elements 121 to 126 such that the total of the propagation delay times caused by the plurality of third delay elements 121 to 126 corresponds to a target value depending on the cycle of the external clock CLK using the plurality of third delay elements 121 to 126. Each of the third delay elements 121 to 126 has a propagation delay time that correlates with the propagation delay time caused by the first delay element 101 and correlates with the propagation delay time caused by the second delay element 102. The control unit 120 controls the propagation delay time caused by the first delay element 101, the propagation delay time caused by the second delay element 102, and the propagation delay times caused by the third delay elements 121 to 126, using a generated control signal.

Specifically, the control unit 120 includes a clock generation unit 127, a phase comparison unit 128, and a delay control unit 129.

The clock generation unit 127 generates a third clock CLK_D that has a third delay time, by causing the external clock CLK to pass through the plurality of third delay elements 121 to 126. The third delay time is a delay time that depends on the total of the propagation delay times caused by the plurality of third delay elements 121 to 126 relative to the external clock CLK.

In the clock generation unit 127, the plurality of third delay elements 121 to 126 are connected in series. The third delay elements 121 to 126 receive a control signal from the delay control unit 129. The third delay elements 121 to 126 delay a clock input upstream for the propagation delay time according to the received control signal, and supply the delayed clock downstream. That is, the propagation delay times caused by the third delay elements 121 to 126 can be controlled.

Here, the first delay element 101, the second delay element 102, and the third delay elements 121 to 126 have the same structure as each other. For example, the first delay element 101, the second delay element 102, and the third delay elements 121 to 126 have the same circuit configuration (for example, the circuit configuration shown in FIG. 2) as each other. Alternatively, for example, the first delay element 101, the second delay element 102, and the third delay elements 121 to 126 may have the same layout configuration as each other, in addition to having the same circuit configuration as each other.

Accordingly, the first delay element 101, the second delay element 102, and the third delay elements 121 to 126 are controlled, when receiving the same control signal as each other, so as to have propagation delay times that correlate with each other according to the received control signal. In other words, it is possible to control the propagation delay time caused by the first delay element 101 and the propagation delay time caused by the second delay element 102, and the propagation delay times caused by the third delay elements 121 to 126 in conjunction with each other.

The phase comparison unit 128 compares the phase of the third clock CLK_D generated by the clock generation unit 127 with the phase of the external clock CLK, and outputs a phase error signal according to the result of comparison.

The delay control unit 129 generates a control signal, according to the phase error signal, such that the total of the propagation delay times of the plurality of third delay elements 121 to 126 is equivalent to the target value depending on the cycle of the external clock. The delay control unit 129 is, for example, a charge pumping circuit that includes a capacitor and charges or discharges the capacitor according to the phase error signal. In this case, the delay control unit 129 outputs a control signal according to the voltage of the capacitor.

That is, the delay control unit 129 supplies the generated control signal to the first delay element 101, the second delay element 102, and the third delay elements 121 to 126, respectively. Accordingly, the delay control unit 129 controls such that the propagation delay time caused by the first delay element 101, the propagation delay time caused by the second delay element 102, and the propagation delay times caused by the third delay elements 121 to 126 are constant according to the cycle of the external clock. That is, the first delay element 101, the second delay element 102, and the third delay elements 121 to 126 receive the same control signal as each other, and are controlled so as to have propagation delay times that correlate with each other according to the received control signal.

Here, the phase comparison unit 128 and the delay control unit 129 perform feedback control on the delay time in the third clock CLK_D output from the clock generation unit 127 relative to the external clock CLK. For example, the phase comparison unit 128 and the delay control unit 129 perform feedback control on the third delay time caused by the plurality of third delay elements 121 to 126 such that the phase of the third clock CLK_D and the phase of the external clock CLK correspond, and just one clock's amount of delay is generated. In this case, the target value for the total of the propagation delay times caused by the plurality of third delay elements 121 to 126 is one cycle of the external clock CLK.

In a state in which the total of the propagation delay times caused by the plurality of third delay elements 121 to 126 has been made equivalent to the target value by the clock generation unit 127, the phase comparison unit 128, and the delay control unit 129, the total of the propagation delay times caused by the plurality of third delay elements 121 to 126 is locked. That is, the clock generation unit 127, the phase comparison unit 128, and the delay control unit 129 constitute a DLL (delay locked loop).

Thus, even if element characteristics change due to the power supply voltage, temperature fluctuation, or variations in the manufacturing process, the above-mentioned DLL is locked in a state in which the total of the propagation delay times caused by the plurality of third delay elements 121 to 126 is equivalent to the target value. In this state, the delay control unit 129 also supplies, to the first delay element 101 and the second delay element 102, a control signal that is supplied to the third delay elements 121 to 126. Accordingly, since the propagation delay time caused by the first delay element 101 and the propagation delay time caused by the second delay element 102 are stabilized in a state in which their respective amounts have become equivalent to a value that correlates with the target value thereof, the non-overlap period of the first clock CK1 and the second clock CK2 becomes constant. That is, it is possible to output a plurality of clocks whose phase relationship has been adjusted so as to be constant according to the cycle of the external clock even when element characteristics change due to the power supply voltage, temperature fluctuation, or variations in the manufacturing process.

Next, an example configuration of the first delay element 101, the second delay element 102, or each of the third delay elements 121 to 126 is described with reference to FIG. 2. FIG. 2 is a diagram showing an example configuration of the first delay element 101, the second delay element 102, or each of the third delay elements 121 to 126.

In FIG. 2, M3 and M6 are p-channel MOS transistors, M1, M2, M4, and M5 are n-channel MOS transistors. The transistors M2 and M3 operate as an inverter, and the transistors M5 and M6 also operate as an inverter. It is possible to consider the transistors M1 and M4 to be approximately constant current sources when responding to the inverters. Depending on the values of the currents that flow through the transistors M1 and M4, and the capacitance values of the load capacitors C, the propagation delay time caused by this delay element is mostly determined.

Here, a control voltage as a control signal dly_ctrl is supplied to the gates of the transistors M1 and M4. That is, it is possible to control the drain current values of the transistors M1 and M4 by controlling the gate voltages of the transistors M1 and M4, and as a result, it is possible to control the propagation delay time caused by this delay element. In the case of FIG. 2, if the gate voltages of the transistors M1 and M4 rise, the propagation delay time caused by the delay element becomes smaller.

Note that although the case in which the delay time is controlled by controlling the gate voltage of an n-channel MOS transistor is described above, a configuration is also possible in which a p-channel-type MOS transistor is connected to the power supply side as a constant current source and the gate voltage of a p-channel MOS transistor is controlled. In this case, if a control voltage rises, the delay time becomes larger. Furthermore, a configuration is also possible in which both an n-channel MOS transistor for control and a p-channel MOS transistor are used, although the configuration is more complicated.

Depending on the application or specification, a load capacitor C is not always necessary.

Next, another example of the configuration of the first delay element 101, the second delay element 102, or each of the third delay elements 121 to 126 is described with reference to FIG. 3. FIG. 3 is a diagram showing another example of the configuration of the first delay element 101, the second delay element 102, or each of the third delay elements 121 to 126.

In FIG. 3, M13, M14, M16, and M18 are p-channel MOS transistors, and M11, M12, M15, and M17 are n-channel MOS transistors. M12 and M13 constitute an inverter, and M17 and M18 also constitute an inverter. M14 and M16 constitute a current mirror. In the present example, the drain current amounts of the transistors M11 and M14 are controlled by controlling the gate voltages of the transistors M11 and M15 using the control signal dly_ctrl and, thereby, the propagation delay time caused by this delay element can be controlled.

Next, yet another example of the configuration of the first delay element 101, the second delay element 102, or each of the third delay elements 121 to 126 is described with reference to FIG. 4. FIG. 4 is a diagram showing yet another example of the configuration of the first delay element 101, the second delay element 102, or each of the third delay elements 121 to 126.

In FIG. 4, M22 and M24 are p-channel MOS transistors, and M21 and M23 are n-channel MOS transistors. The transistors M21 and M22 constitute an inverter, and the transistors M23 and M24 constitute a variable resistance. In the present example, a control signal dly_ctrl_p is supplied to the gate of the transistor M24, and a control signal dly_ctrl_n is supplied to the gate of the transistor M23. That is, the combined resistance value of the transistors M23 and M24 is controlled by controlling the gate voltages of the transistors M23 and M24, respectively and, thereby, it is possible to control the propagation delay time caused by this delay element.

Although a two phase non-overlap clock can be used in, for example, a switched capacitor circuit, if the amount of non-overlap is changed, the characteristics of the circuit easily change. In a shift register circuit, if the amount of non-overlap becomes excessively small, the circuit will malfunction. In regard to this, according to the present embodiment described above, since the amount of non-overlap does not change even if the element characteristics of a circuit change, a two-phase non-overlap clock can be used in a switched capacitor circuit or a shift register circuit, for example.

Figure 5:
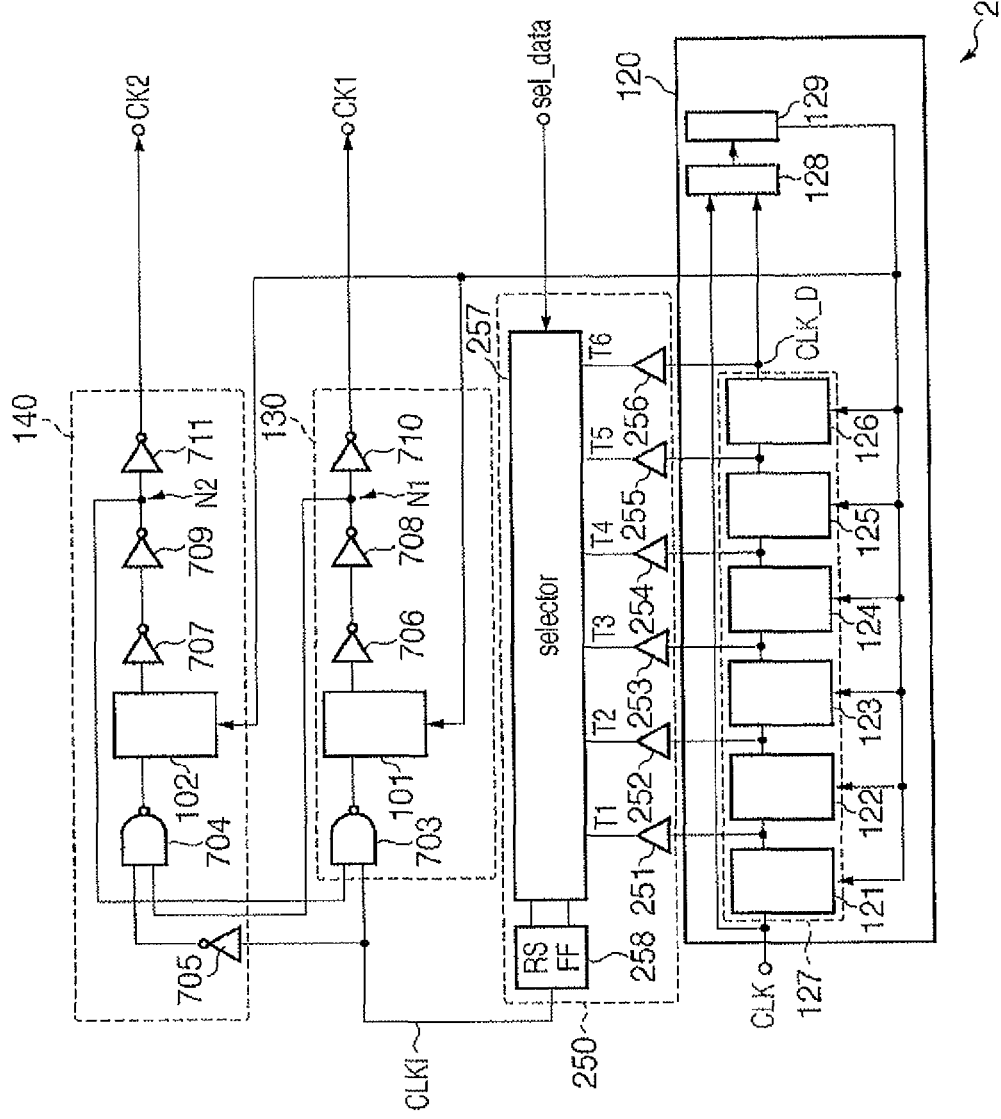
FIG. 5 is a diagram showing the configuration of a clock generation circuit 200 according to a second embodiment of the present invention.

Next, a clock generation circuit 200 according to a second embodiment of the present invention is described with reference to FIG. 5. FIG. 5 is a diagram showing the configuration of the clock generation circuit 200 according to the second embodiment of the present invention. In the following, a description is given focusing on the points that differ from those in the first embodiment.

There are many cases in which the clock generation circuit 200 needs a mechanism for adjusting the timing at which sampling is performed on an analog signal when the clock generation circuit 200 is applied to a pipelined AD converter, and the like.

In regard to this, the clock generation circuit 200 according to the present embodiment is provided with a timing adjustment unit 250. The timing adjustment unit 250 includes buffers 251 to 256, a selector circuit 257, and a RS flip-flop 258.

The buffers 251 to 256 buffer clocks output by the third delay elements 121 to 126, respectively, and supply the buffered clocks to taps T1 to T6 of the selector circuit 257.

The selector circuit 257 selects a tap for setting signals, and a tap for reset signals according to a selection signal sel_data that is supplied from the outside or generated internally. The selector circuit 257 supplies a clock received by the tap for setting signals to a setting terminal of the RS flip-flop 258, and supplies a clock received by the tap for reset signals to a reset terminal of the RS flip-flop 258.

Figure 6:
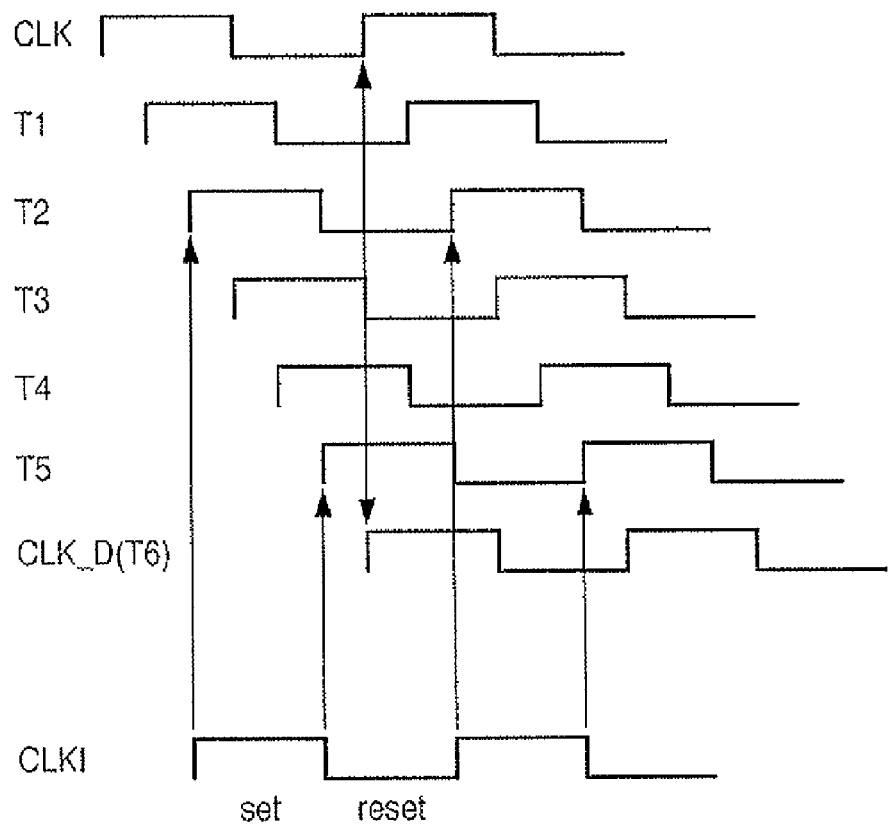
FIG. 6 is a timing chart showing an operation performed by a timing adjustment unit 250 in the second embodiment of the present invention.

For example, in the case shown in FIG. 6, the selector circuit 257 selects the tap T2 as a tap for setting signals, and selects the tap T5 as a tap for reset signals. In this case, the selector circuit 257 supplies a clock received by the tap T2 to the setting terminal of the RS flip-flop 258, and supplies a clock received by the tap T5 to the reset terminal of the RS flip-flop 258. Note that FIG. 6 is a timing chart showing an operation performed by the timing adjustment unit 250 in the second embodiment of the present invention.

The RS flip-flop 258 performs a setting operation synchronizing with the rising of the clock supplied to the setting terminal, and performs a reset operation synchronizing with the rising of the clock supplied to the reset terminal.

For example, in the case shown in FIG. 6, the RS flip-flop 258 performs a setting operation synchronizing with the rising of the clock shown by T2, and performs a reset operation synchronizing with the rising of the clock shown by T5.

Accordingly, the RS flip-flop 258 generates an internal clock CLKI, and supplies the generated clock to the first generation unit 130 and the second generation unit 140, respectively.

In this way, the phase of the external clock CLK and the phase of the third clock CLK_D are caused to correspond with a delay of one clock cycle, and the internal clock CLKI is separately generated, and supplied to the first generation unit 130 and the second generation unit 140, respectively. In this case, the first clock CK1 generated by the first generation unit 130 and the second clock CK2 generated by the second generation unit 140 become clocks that have a phase suitable for use as an operation clock of a pipelined AD converter. That is, according to the present embodiment, it is possible to relatively adjust the phase of the first clock CK1 and the phase of the second clock CK2 with respect to the external clock CLK such that the phases thereof are suitable for use as an operation clock of an AD converter. As a result of this, phase adjustment of a sampling timing suitable for an operation clock of an AD converter is possible.

Figure 7:
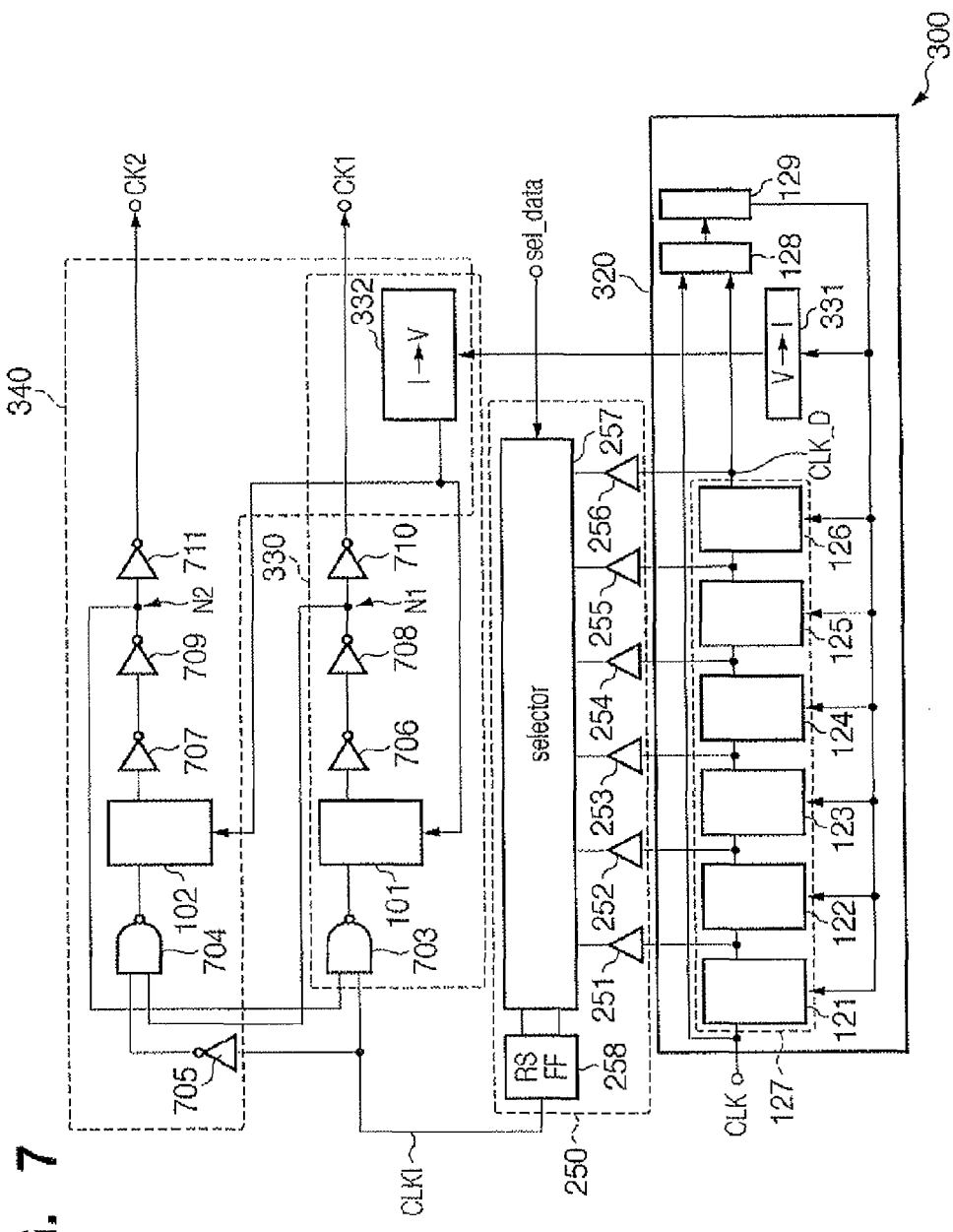
FIG. 7 is a diagram showing the configuration of a clock generation circuit 300 according to a third embodiment of the present invention.

Next, a clock generation circuit 300 according to a third embodiment of the present invention is described with reference to FIG. 7. FIG. 7 is a diagram showing the configuration of the clock generation circuit 300 according to the third embodiment of the present invention. In the following, a description is given focusing on the points that differ from those in the second embodiment.

In the second embodiment, the delay control unit 129 supplies a generated control signal, for example, in the form of a voltage to the first delay element 101, the second delay element 102, and the third delay elements 121 to 126, respectively.

In regard to this, in the present embodiment, the clock generation circuit 300 is provided with a first generation unit 330, a second generation unit 340, and a control unit 320.

The control unit 320 includes a voltage-current converting block 331. The voltage-current converting block 331 converts a control signal output from the delay control unit 129 to the first delay element 101 and the second delay element 102 from the form of a voltage into the form of a current. The voltage-current converting block 331 supplies the control signal in the form of a current to the first generation unit 330 and the second generation unit 340.

The first generation unit 330 and the second generation unit 340 include a current-voltage converting block 332 in common. The current-voltage converting block 332 converts the control signal supplied from the voltage-current converting block 331 from the form of a current into the form of a voltage. The current-voltage converting block 332 supplies the control signal in the form of a voltage to the first delay element 101 and the second delay element 102, respectively.

In this way, since a control signal is transmitted in the form of a current between circuit blocks, it is possible to avoid the control signal being influenced by changes in the power supply voltage between circuit blocks. As a result of this, it is possible to reduce an error component incorporated in a control signal during the process of transmission.

Figure 8:
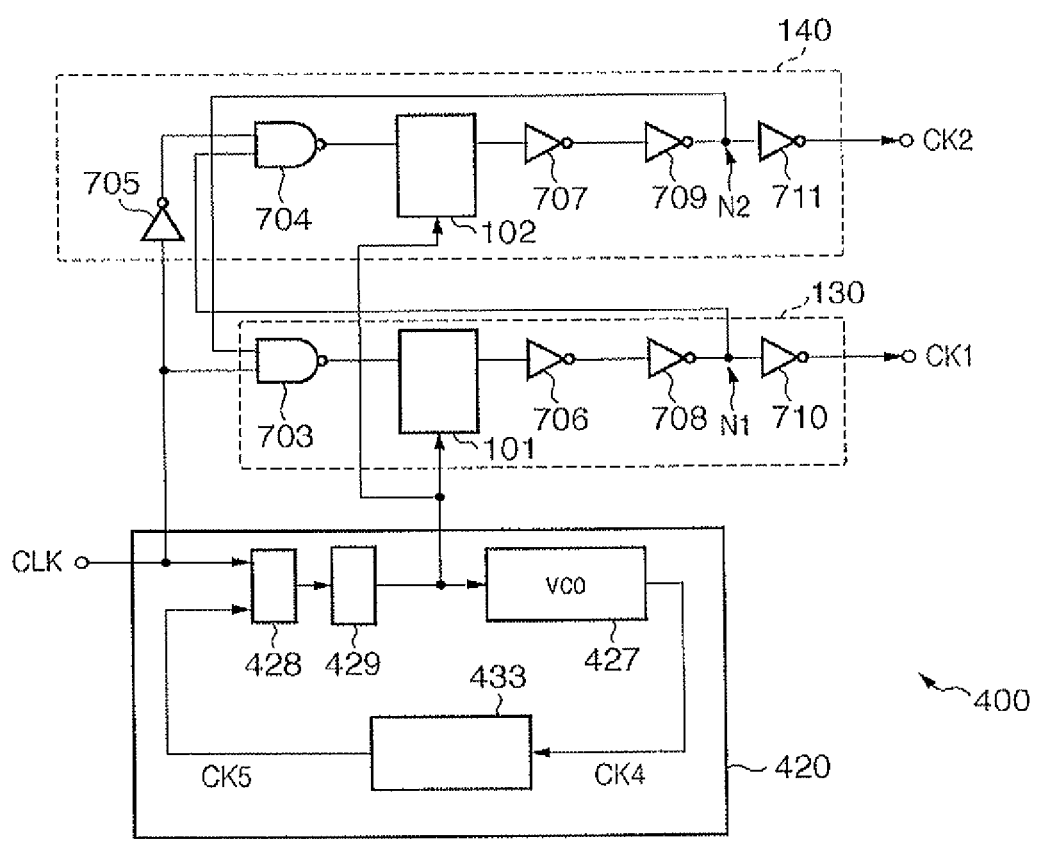
FIG. 8 is a diagram showing the configuration of a clock generation circuit 400 according to a fourth embodiment of the present invention.

Next, a clock generation circuit 400 according to a fourth embodiment of the present invention is described with reference to FIG. 8. FIG. 8 is a diagram showing the configuration of the clock generation circuit 400 according to the fourth embodiment of the present invention. In the following, a description is given focusing on the points that differ from those in the first embodiment.

The clock generation circuit 400 is provided with a control unit 420. The control unit 420 includes a VCO (voltage controlled oscillator) circuit (oscillation unit) 427, a frequency divider unit 433, a phase comparison unit 428, and a delay control unit 429.

The VCO circuit 427 generates a fourth clock CK4 using a plurality of third delay elements 421 to 423 (see FIG. 9) by oscillating at a frequency depending on the propagation delay times caused by the plurality of third delay elements 421 to 423.

The frequency divider unit 433 receives the fourth clock CK4 output from the VCO circuit 427. The frequency divider unit 433 divides the frequency of the received fourth clock CK4, and generates a frequency division clock CK5.

The phase comparison unit 428 compares the phase of the frequency division clock CK5 received from the frequency divider unit 433 with the phase of the external clock CLK, and outputs a phase error signal according to the result of comparison.

According to the phase error signal, the delay control unit 429 generates a control signal such that the phase of the frequency division clock CK5 and the phase of the external clock CLK are equivalent. The delay control unit 429 supplies the generated control signal to the first delay element 101, the second delay element 102, and the plurality of third delay elements 421 to 423, respectively. Accordingly, the delay control unit 429 controls such that the propagation delay time caused by the first delay element 101, the propagation delay time caused by the second delay element 102, and the propagation delay times caused by the third delay elements 421 to 423 are constant according to the cycle of the external clock.

Here, the phase comparison unit 428 and the delay control unit 429 perform feedback control on the phase error, relative to the external clock CLK, of the frequency division clock CK5 that was output from the VCO circuit 427 and whose frequency has been divided by the frequency divider unit 433. For example, the phase comparison unit 428 and the delay control unit 429 perform feedback control on the oscillation frequency of the VCO circuit 427 such that the phase of the frequency division clock CK5 and the phase of the external clock CLK are equivalent.

In a state in which the total of the propagation delay times caused by the plurality of third delay elements 421 to 423 is made equivalent to the target value by the VCO circuit 427, the frequency divider unit 433, the phase comparison unit 428, and the delay control unit 429, the phase relationship between the external clock CLK and the fourth clock CK4 is locked. That is, the VCO circuit 427, the frequency divider unit 433, the phase comparison unit 428, and the delay control unit 429 constitute a PLL (phase locked loop).

Even when element characteristics change due to the power supply voltage, temperature fluctuation, or variations in the manufacturing process, the above-mentioned PLL is locked in a state in which the total of the propagation delay times caused by the plurality of third delay elements 421 to 423 is equivalent to the target value. In this state, the delay control unit 429 also supplies, to the first delay element 101 and the second delay element 102, the control signal that is supplied to the plurality of third delay elements 421 to 423. Accordingly, since the propagation delay time caused by the first delay element 101 and the propagation delay time caused by the second delay element 102 are stabilized in a state in which the respective amounts have become equivalent to a value that correlates with the target value thereof, the non-overlap period of the first clock CK1 and the second clock CK2 becomes constant. That is, even when element characteristics change due to the power supply voltage, temperature fluctuation, or variations in the manufacturing process, it is possible to output a plurality of clocks whose phase relationship has been adjusted so as to be constant according to the cycle of the external clock.

Figure 9:
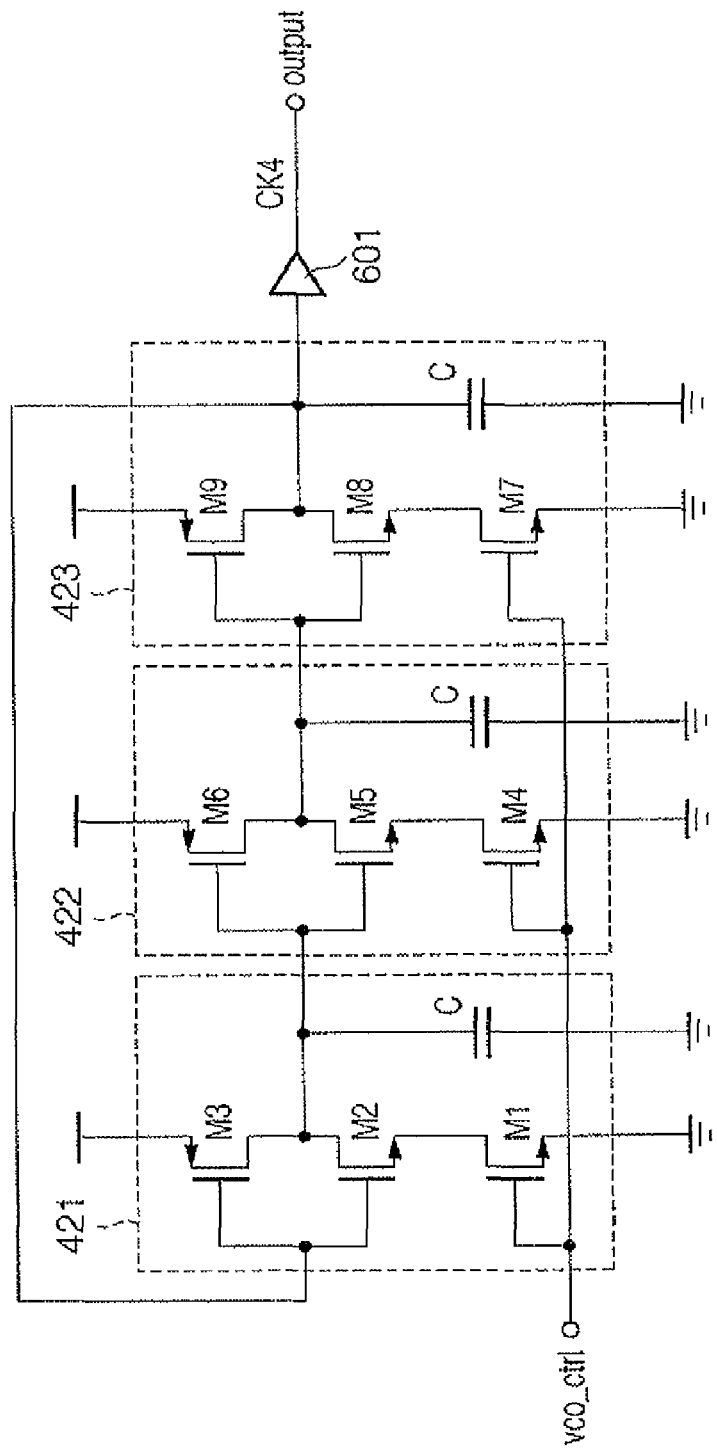
FIG. 9 is a diagram showing an example configuration of a VCO circuit 427 in the fourth embodiment of the present invention.

Next, an example configuration of the VCO circuit 427 is described with reference to FIG. 9. FIG. 9 is a diagram showing an example configuration of the VCO circuit 427 in the fourth embodiment of the present invention.

In FIG. 9, M3, M6, and M9 are p-channel MOS transistors, and M1, M2, M4, M5, M7, and M8 are n-channel MOS transistors. The transistors M2 and M3 operate as an inverter. The transistors M5 and M6 operate as an inverter. The transistors M8 and M9 operate as an inverter. A ring oscillator having three inverter stages is constituted by connecting the drain between the transistors M8 and M9 to the gates of the transistors M2 and M3. Further, the transistors M1 to M3 and the load capacitor C disposed on the downstream thereof constitute the third delay element 421. The transistors M4 to M6 and the load capacitor C disposed on the downstream thereof constitute the third delay element 422. The transistors M7 to M9 and the load capacitor C disposed on the downstream thereof constitute the third delay element 423.

Here, a voltage as a control signal vco_ctrl is supplied to the gates of the transistors M1, M4, and M7. That is, since it is possible to control the drain current values of the transistors M1, M4, and M7 by controlling the gate voltages of the transistors M1, M4, and M7, it is possible to control the propagation delay times caused by the inverters. As a result, the oscillation frequency of the ring oscillator changes according to the control signal vco_ctrl. In the case of FIG. 9, if the gate voltages of the transistors M1, M4, and M7 rise, the oscillation frequency of the ring oscillator becomes higher. In this way, a clock produced by the oscillation of the ring oscillator is output as the fourth clock CK4 by a buffer 601.

The respective configurations of the first delay element and the second delay element (for example, the circuit configuration shown in FIG. 2) are the same as the configuration of the third delay elements (for example, the circuit configuration of the third delay elements 421 to 423 shown in FIG. 9). Accordingly, the first delay element, the second delay element, and the third delay element receive the same control signal as each other, and are controlled so as to have a propagation delay time that correlates with each other, according to the received control signal.

Figure 10:
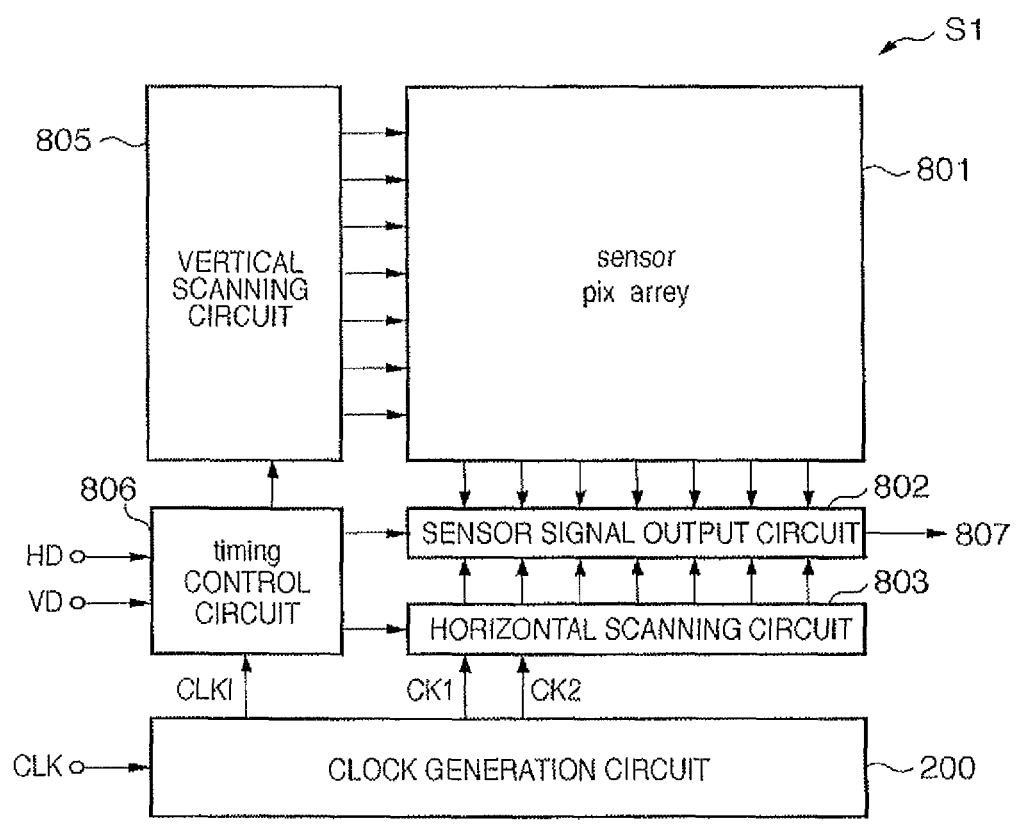
FIG. 10 is a diagram showing an example of an image sensor to which the clock generation circuit 200 according to the second embodiment of the present invention is applied.

Next, an example of an image sensor to which the clock generation circuit 200 according to the second embodiment of the present invention is applied is shown in FIG. 10.

An image sensor S1 shown in FIG. 10 is provided with a sensor pixel array 801, a sensor signal output circuit 802, a horizontal scanning circuit 803, a clock generation circuit 200, a vertical scanning circuit 805, and a timing control circuit 806. Reference numeral 807 denotes a common output line used for sequentially outputting a sensor signal. HD denotes a horizontal synchronizing signal, and VD denotes a vertical synchronizing signal.

The clock generation circuit 200 generates the internal clock CLKI, the first clock CK1, and the second clock CK2 synchronizing with the external clock CLK.

The clock generation circuit 200 supplies the internal clock CLKI to the timing control circuit 806. The timing control circuit 806 receives the internal clock CLKI from the clock generation circuit 200, and receives the horizontal synchronizing signal HD and the vertical synchronizing signal VD from the outside. Accordingly, the timing control circuit 806 generates a driving pulse that synchronizes with the internal clock CLKI for each of the horizontal scanning circuit 803, the vertical scanning circuit 805, and the sensor signal output circuit 802, based on the horizontal synchronizing signal HD and the vertical synchronizing signal VD.

Further, the clock generation circuit 200 supplies the first clock CK1 and the second clock CK2 to the horizontal scanning circuit 803. The horizontal scanning circuit 803 receives the first clock CK1 and the second clock CK2 from the clock generation circuit 200, and receives a driving pulse from the timing control circuit 806. Accordingly, the horizontal scanning circuit 803 generates a horizontal transfer signal according to the first clock CK1, the second clock CK2, and the driving pulse, and supplies the generated signal to the sensor signal output circuit 802.

Here, a non-overlap period of the first clock CK1 and the second clock CK2 undergoes little change due to temperature or variations during manufacturing, with the effect of the present invention, which is advantageous when designing a horizontal scanning circuit.

Figure 11:
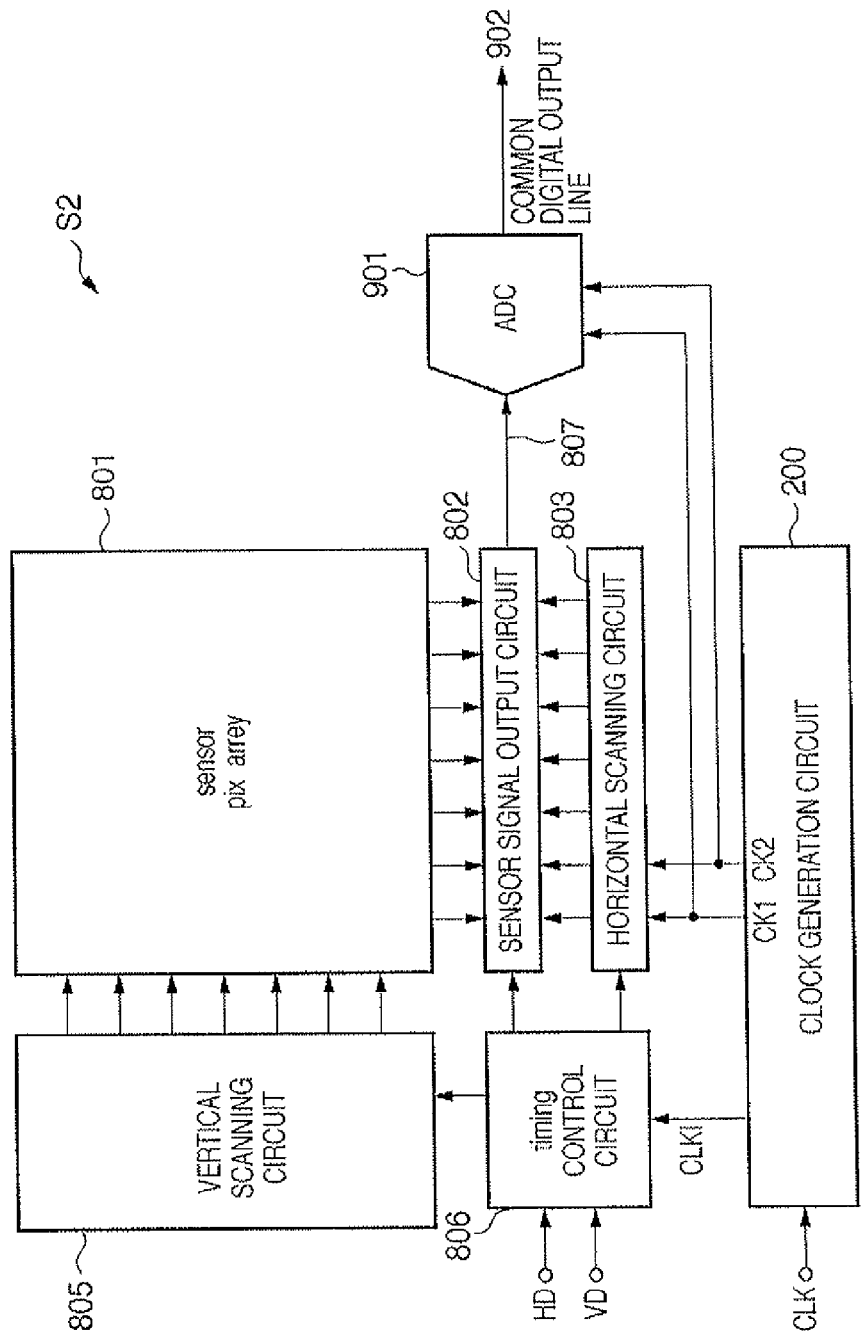
FIG. 11 is a diagram showing another example of an image sensor to which the clock generation circuit 200 according to the second embodiment of the present invention is applied.

Next, another example of an image sensor to which the clock generation circuit 200 according to the second embodiment of the present invention is applied is shown in FIG. 11. In the following, a description is given focusing on the points that differ from those of the image sensor S1 shown in FIG. 10.

An image sensor (integrated circuit) S2 shown in FIG. 11 is provided with an AD converter 901. Reference numeral 902 denotes a common digital output line used for sequentially outputting the digitized sensor signal. The type of circuit in the AD converter 901 is a pipelined AD conversion circuit. Generally, a pipelined AD conversion circuit operates using a two-phase clock that has a non-overlap period, and a change in the non-overlap period readily causes changes in the characteristics, and restricts the circuit operation margin.

In regard to this, the clock generation circuit 200 supplies, to the AD converter 901, the first clock CK1 and the second clock CK2 that have been adjusted such that changes in a non-overlap period due to temperature or variations during manufacturing are reduced, with the effect of the present invention. The AD converter 901 operates using the first clock CK1 and the second clock CK2 that are output from the clock generation circuit 200. Accordingly, the AD converter 901 can perform an A/D conversion process on the sensor signal (analog signal) output from the sensor signal output circuit 802 at a high speed and with high precision.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-305627, filed Nov. 28, 2008, which is hereby incorporated by reference herein in its entirety.

What is claimed is:

1. An image sensing apparatus comprising a clock generation circuit that generates and outputs first and second clocks that have a different delay time relative to an external clock, and a pixel array having a plurality of pixels, and configured to operate in accordance with signals which are generated based on the first and second clocks, the clock generation circuit comprising:
   a first generation unit that generates, by causing the external clock to pass through a first delay element, the first clock that has a first delay time depending on a propagation delay time of the first delay element relative to the external clock, and outputs the generated first clock;
   a second generation unit that generates, by causing the external clock to pass through a second delay element, the second clock that has a second delay time depending on a propagation delay time of the second delay element relative to the external clock, and outputs the generated second clock; and
   a control unit that, using a plurality of third delay elements that respectively have a propagation delay time that correlates with the propagation delay time of the first delay element, and correlates with the propagation delay time of the second delay element, generates a control signal for controlling the third delay elements such that a total of propagation delay times of the plurality of third delay elements corresponds to a target value depending on a cycle of the external clock, and controls the propagation delay time of the first delay element, the propagation delay time of the second delay element, and the propagation delay times of the third delay elements using the control signal.

2. The apparatus according to claim 1, wherein the first clock and the second clock have a non-overlap period.

3. The apparatus according to claim 1, wherein the control unit includes:
   a clock generation unit including the plurality of third delay elements, that generates, by causing the external clock to pass through the plurality of third delay elements, a third clock that has a third delay time depending on the total of the propagation delay times of the plurality of third delay elements relative to the external clock;
   a phase comparison unit that compares a phase of the third clock generated by the clock generation unit with a phase of the external clock, and outputs a phase error signal according to a result of the comparison; and
   a delay control unit that generates a control signal according to the phase error signal such that the total of the propagation delay times of the plurality of third delay elements corresponds to the target value, and controls by supplying the control signal to the first delay element, the second delay element, and the plurality of third delay elements, respectively, such that the propagation delay time of the first delay element, the propagation delay time of the second delay element, and the propagation delay times of the third delay elements are constant according to the cycle of the external clock.

4. The apparatus according to claim 1, wherein the control unit includes:
   an oscillation unit including the plurality of third delay elements, that generates a fourth clock, by using the plurality of third delay elements to oscillate at a frequency depending on the total of the propagation delay times of the plurality of third delay elements;
   a frequency divider unit that divides a frequency of the fourth clock and generates a frequency division clock;

a phase comparison unit that compares a phase of the frequency division clock received from the frequency divider unit with a phase of the external clock, and outputs a phase error signal according to a result of the comparison; and a delay control unit that generates a control signal according to the phase error signal such that the phase of the frequency division clock and the phase of the external clock are equivalent, and controls by supplying the control signal to the first delay element, the second delay element, and the oscillation unit, respectively, such that the propagation delay time of the first delay element, the propagation delay time of the second delay element, and the propagation delay times of the third delay elements are constant according to the cycle of the external clock.

5. The apparatus according to claim 1, wherein
the first delay element, the second delay element, and the third delay elements receive a same control signal as each other, and are controlled according to the received control signal so as to have a propagation delay time that correlates with each other.

6. The apparatus according to claim 1, wherein
the first delay element, the second delay element, and the third delay elements have a same structure as each other.

7. The apparatus according to claim 1, further comprising a scanning circuit configured to control an operation of reading signals from the pixel array, in accordance with the first and second clocks.

8. The apparatus according to claim 1, further comprising an AD converter configured to perform an A/D conversion on a signal output from the pixel array, in accordance with the first and second clocks.

9. An image sensing apparatus comprising a clock generation circuit that generates and outputs first and second clocks that have a non-overlap period with respect to an external clock, and a pixel array having a plurality of pixels, and configured to operate in accordance with signals which are generated based on the first and second clocks, the clock generation circuit comprising:
   a first generation unit including a first delay element, that generates, by causing the external clock to pass through the first delay element, the first clock that has a first delay time depending on a propagation delay time of the first delay element relative to the external clock, and outputs the generated first clock;
   a second generation unit including a second delay element, that generates, by causing the external clock to pass through the second delay element, the second clock that has a second delay time depending on a propagation delay time of the second delay element relative to the external clock, and outputs the generated second clock; and
   a control unit including a plurality of third delay elements, that generates a control signal for controlling the third delay elements such that a total of propagation delay times caused by the plurality of third delay elements corresponds to a target value depending on a cycle of the external clock by causing the external clock to pass through the plurality of third delay elements, and controls, by supplying the control signal to the first delay element, the second delay element, and the plurality of third delay elements, respectively, the propagation delay time of the first delay element, the propagation delay time of the second delay element, and the propagation delay time of the third delay element.

10. The apparatus according to claim 9, further comprising a scanning circuit configured to control an operation of reading signals from the pixel array, in accordance with the first and second clocks.

11. The apparatus according to claim 9, further comprising an AD converter configured to perform an A/D conversion on a signal output from the pixel array, in accordance with the first and second clocks.

12. An image sensing apparatus comprising a clock generation circuit that generates and outputs first and second clocks that have a non-overlap period with respect to an external clock, and a pixel array having a plurality of pixels, and configured to operate in accordance with signals which are generated based on the first and second clocks, the clock generation circuit comprising:
   a first generation unit including a first delay element, that generates, by causing the external clock to pass through the first delay element, the first clock that has a first delay time depending on a propagation delay time of the first delay element relative to the external clock, and outputs the generated first clock;
   a second generation unit including a second delay element, that generates, by causing the external clock to pass through the second delay element, the second clock that has a second delay time depending on a propagation delay time of the second delay element relative to the external clock, and outputs the generated second clock; and
   a control unit including a plurality of third delay elements, that oscillates at a frequency depending on a total of propagation delay times caused by the plurality of third delay elements so as to generate a third clock, generates a control signal for controlling the third delay elements such that the total of the propagation delay times of the plurality of third delay elements corresponds to a target value depending on a cycle of the external clock by comparing a phase of a frequency division clock obtained by dividing a frequency of the generated third clock with a phase of the external clock, and controls, by supplying the control signal to the first delay element, the second delay element, and the plurality of third delay elements, respectively, the propagation delay time of the first delay element, the propagation delay time of the second delay element, and the propagation delay time of the third delay element.

13. The apparatus according to claim 12, further comprising a scanning circuit configured to control an operation of reading signals from the pixel array, in accordance with the first and second clocks.

14. The apparatus according to claim 12, further comprising an AD converter configured to perform an A/D conversion on a signal output from the pixel array, in accordance with the first and second clocks.

* * * * *